US007724069B1

(12) United States Patent  (10) Patent No.: US 7,724,069 B1
Webb  (45) Date of Patent: May 25, 2010

(54) ANALOG SWITCH FOR OPERATION OUTSIDE POWER RAILS WITH LOW SUPPLY CURRENT

(75) Inventor: Robert W. Webb, Palm Bay, FL (US)

(73) Assignee: Intersil Americas Inc., Milpitas, CA (US)

( * ) Notice: Subject to any disclaimer, the term of this patent is extended or adjusted under 35 U.S.C. 154(b) by 17 days.

(21) Appl. No.: 12/260,721

(22) Filed: Oct. 29, 2008

Related U.S. Application Data

(60) Provisional application No. 60/983,608, filed on Oct. 30, 2007.

(51) Int. Cl.
*H03K 3/01* (2006.01)
(52) U.S. Cl. ........................................ 327/534; 327/404
(58) Field of Classification Search .................. 327/379, 327/403, 404, 427, 534, 535, 537
See application file for complete search history.

(56) References Cited

U.S. PATENT DOCUMENTS

| | | | | |
|---|---|---|---|---|
| 5,594,381 | A | * | 1/1997 | Bingham .................... 327/534 |
| 6,020,778 | A | * | 2/2000 | Shigehara et al. ........... 327/534 |
| 6,194,952 | B1 | * | 2/2001 | Shigehara .................... 327/534 |
| 6,567,024 | B1 | * | 5/2003 | Ishikawa .................... 341/136 |
| 6,828,846 | B2 | * | 12/2004 | Tsukazaki et al. ........... 327/404 |

* cited by examiner

*Primary Examiner*—Hai L Nguyen
(74) *Attorney, Agent, or Firm*—Gary R. Stanford (57) ABSTRACT

A switch circuit, which selectively couples first and second switch nodes together and which enables the first and second switch nodes to operate in an extended voltage range, includes a secondary voltage rail, a switch device, a body driver, a rail control switch, and a switch control circuit. The rail control switch clamps the secondary voltage rail to a primary voltage rail during normal voltage range operation, but otherwise releases the secondary voltage rail to float. The body driver clamps the body of the switch to the secondary voltage rail when turned on, and when turned off, forward biases to allow voltage of said secondary voltage rail to follow voltage of the switch nodes into the extended voltage range through the switch. The switch control circuit includes a latch circuit which ensures that the switch remains either turned on or turned off during extended voltage operation.

20 Claims, 4 Drawing Sheets

ANALOG SWITCH FOR OPERATION OUTSIDE POWER RAILS WITH LOW SUPPLY CURRENT

CROSS-REFERENCE TO RELATED APPLICATIONS

This application claims the benefit of U.S. Provisional Application Ser. No. 60/983,608, filed on Oct. 30, 2007, which is herein incorporated by reference for all intents and purposes.

BRIEF DESCRIPTION OF THE DRAWINGS

A fuller understanding of the present invention and the features and benefits thereof will be accomplished upon review of the following detailed description together with the accompanying drawings, in which.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

Metal-oxide semiconductor (MOS) analog switches typically comprise an arrangement of N-channel and P-channel devices coupled in parallel to provide a relatively constant ON resistance over a range of signal voltage. An analog switch according to a conventional configuration provides a useful signal range that is nearly equal to, but constrained within, the regular power supply rails. It is desired to extend the allowed signal range outside the regular power supply rails of the analog switch. A conventional approach has been to include internal charge pumps which, in effect, generate secondary power rails outside the primary rails and across which the switch circuitry operates. The secondary rails then become the limits of the allowed signal ranges. This conventional approach extends the useful signal range of the analog switch, but involves a substantial increase in the circuit complexity and requires a significant DC power supply current which would not otherwise be required.

Figure 1:
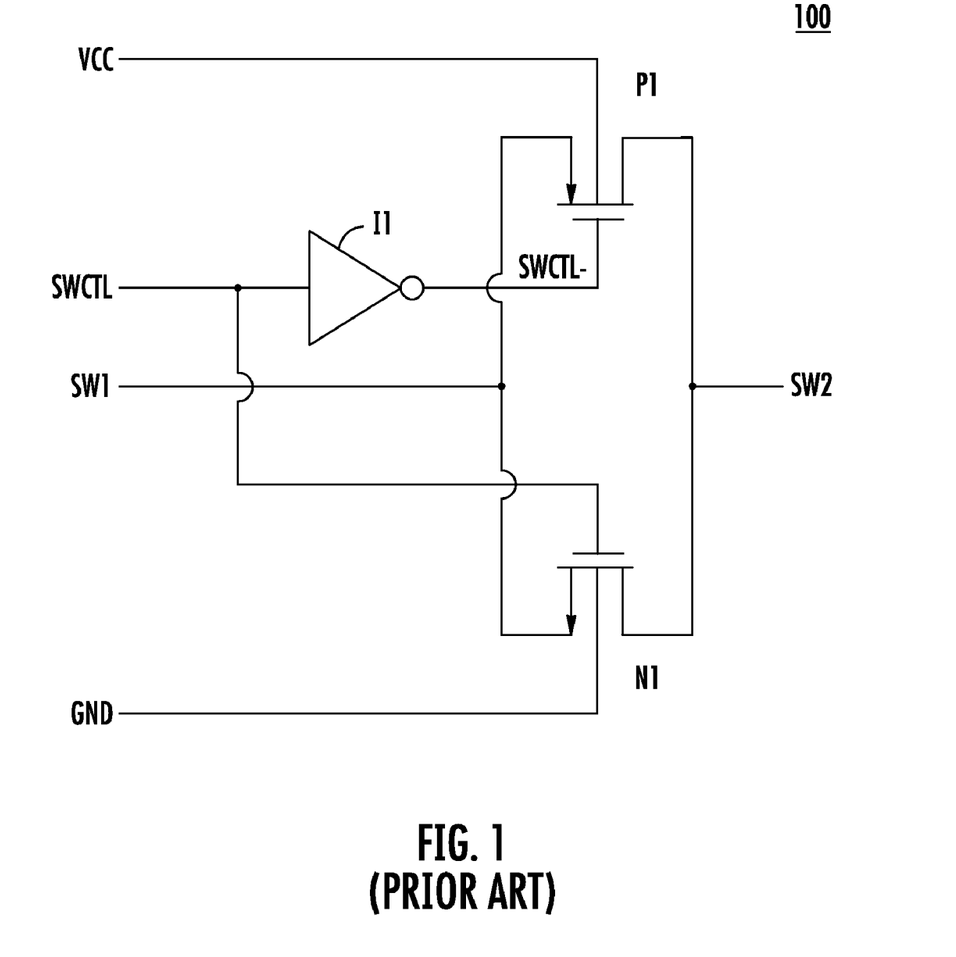
FIG. 1 is a schematic diagram of a simple conventional analog switch according to prior art.

FIG. 1 is a schematic diagram of a simple conventional analog switch 100 according to prior art. The analog switch 100 includes a P-channel device P1 having its bulk or body coupled to a first power supply rail VCC and an N-channel device N1 having its body coupled to a second power supply rail GND (ground). The sources of P1 and N1 are coupled together and receive a first switch signal at a first switch node SW1. A node and the signal it carries are referred to by the same name unless otherwise specified. The drains of P1 and N1 are coupled together and provide a second switch signal on a second switch node SW2. A logic switch control signal SWCTL is provided to the input of an inverter I1 and to the gate of N1. The inverter I1 is powered between VCC and GND. The output of inverter I1 provides an inverted switch control signal SWCTL—which is provided to the gate of P1. It is noted that a dash "-" appended to the end of a signal name denotes an inverted version of the signal unless otherwise indicated.

In many configurations the drain is extended so that the devices are somewhat asymmetrical. In one embodiment, the PMOS and NMOS devices shown and described herein have their drains extended and have their drains and sources made with substantially the same geometries resulting in symmetrical devices. In this manner, the drains and sources of the symmetrical P-channel and N-channel devices are interchangeable from an electrical standpoint so that the actual drain and source of any given device depends upon relative voltage levels. For symmetrical or asymmetrical devices, the drain and source may alternatively be referred to as current terminals and the path between the current terminals is referred to as a current path of the semiconductor device. The gates of the N-channel and P-channel semiconductor devices are otherwise referred to as control terminals. In one embodiment, the P-channel devices are PMOS devices and the N-channel devices are NMOS devices according to complementary MOS (CMOS) configurations. In one embodiment, the analog switch is integrated onto a semiconductor die or integrated circuit (IC).

In operation of the analog switch 100, the SWCTL signal is pulled low to turn the analog switch 100 off by turning off N1 and P1. When off, the SW1 node is effectively isolated from SW2. When the SWCTL signal is pulled high, N1 and P1 are both turned on coupling the SW1 and SW2 nodes together. In this manner, a signal on SW1 is generally able to pass through the analog switch 100 as the signal on SW2 and vice-versa. The bodies of the switch devices P1 and N1 are permanently connected to the rail voltages VCC and GND so that the SW1 and SW2 nodes are also constrained within the normal voltage range between VCC and GND. When the analog switch 100 is turned on and if the voltage of either node SW1 or SW2 approaches or exceeds either rail VCC or GND, the signal is distorted. When the analog switch 100 is turned off and if either switch node SW1 or SW2 approaches or exceeds either rail VCC or GND, undesirable switch terminal currents flow through the analog switch 100. The analog switch 100 is very simple at the expense of higher ON resistance through the current terminals of P1 and N1.

Figure 2:
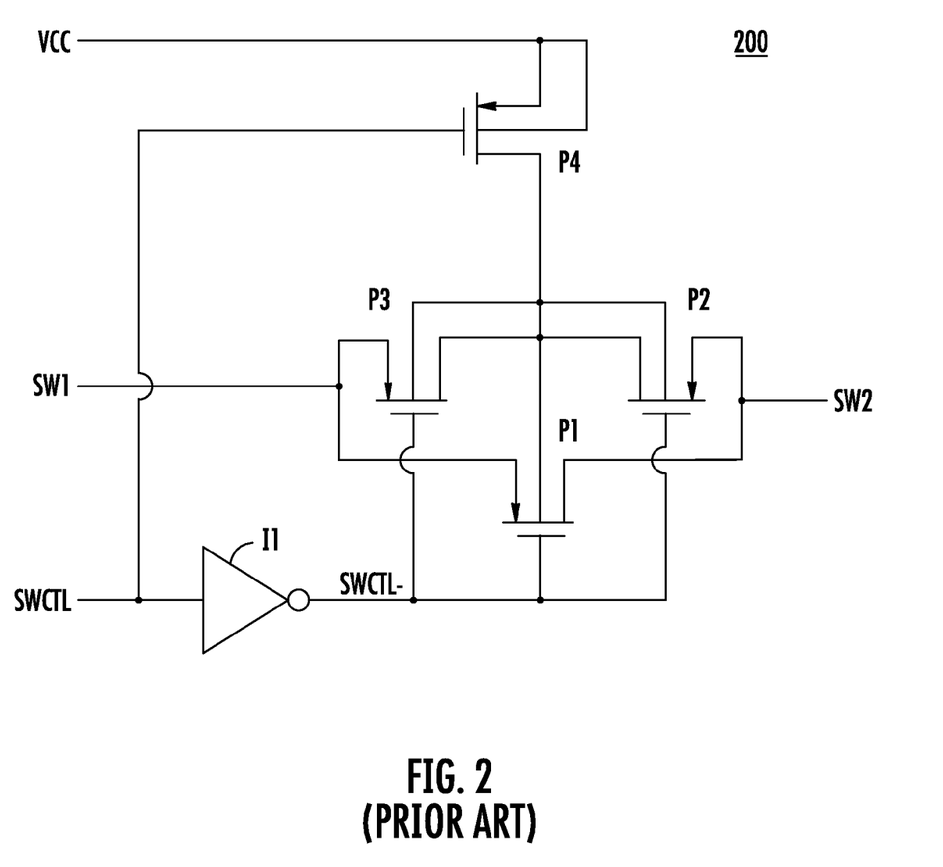
FIG. 2 is a schematic diagram of the P-channel portion of another conventional analog switch according to prior art with a lower ON resistance characteristic as compared to the analog switch of FIG. 1.

FIG. 2 is a schematic diagram of the P-channel portion of another conventional analog switch 200 according to prior art with a lower ON resistance characteristic as compared to the analog switch 100. Although only the P-channel portion is shown for purposes of simplicity, it is understood by those skilled in the art that an N-channel mirror image and corresponding drive circuitry are employed. The analog switch 200 includes the inverter I1, powered between GND and VCC, having an input receiving the SWCTL signal and an output providing the SWCTL—signal in similar fashion. In this case, the output of the inverter I1 is coupled to the gates of three P-channel devices P1, P2 and P3. The drains and bodies of P2 and P3 are coupled together to the body of P1 and to the drain of another P-channel device P4, which has its gate receiving the SWCTL signal. The source and body of P4 are coupled to VCC. The sources of P1 and P3 coupled together at the first switch node SW1, and the drain of P1 and the source of P2 are coupled together at the second switch node SW2.

Operation of the analog switch 200 is similar to that described for the analog switch 100. When the SWCTL signal is pulled low to turn off the analog switch 200 by turning the devices P1-P3 off, P4 is turned on pulling the drains and bodies of P2 and P3 and the body of P1 high to VCC. When the SWCTL signal is low, the inverter I1 pulls SWCTL—high which turns off P1-P3 by pulling their gates high. When the SWCTL signal is high to turn on the analog switch 200, P4 is turned off and P1-P3 are turned on to enable signal flow between SW1 and SW2. The series coupling of P2 and P3 coupled in parallel with P1 reduces the ON resistance between the input and output nodes thereby reducing distortion between SW1 and SW2. If either switch node, such as, for example, SW1, is pulled to a voltage approaching or exceeding VCC, the source and bodies of P3 and P4 begin to forward bias. If the analog switch 200 is turned on (SWCTL is high) in this condition, then the forward bias of P3 and P4 prevents the voltage of SW2 from accurately following the voltage of SW1 (or vice-versa) thereby distorting the signal. If the analog switch 200 is turned off (SWCTL is low) under this condition, the forward bias of P3 and P4 causes undesirable switch terminal currents to flow. In this manner, the input and output signals are constrained within the normal limits of the rail voltages and distortion or undesirable currents are generated when either switch node SW1 or SW2 exceeds the normal voltage range of the rail voltages GND and VCC.

It is possible to extend the allowed signal range of the conventional analog switches 100 or 200 beyond the normal limits of the rail voltages and even beyond the levels of the regular supply rails VCC and GND. A conventional approach has been to include internal charge pumps which, in effect, generate secondary power rails outside the primary rails and across which the switch circuitry operates. The secondary rails then become the limits of the allowed signal ranges. This conventional approach extends the useful signal range of the analog switch. The additional charge pumps, however, involve a substantial increase of the circuit complexity and requires a significant DC power supply current which would not otherwise be required.

Figure 3:
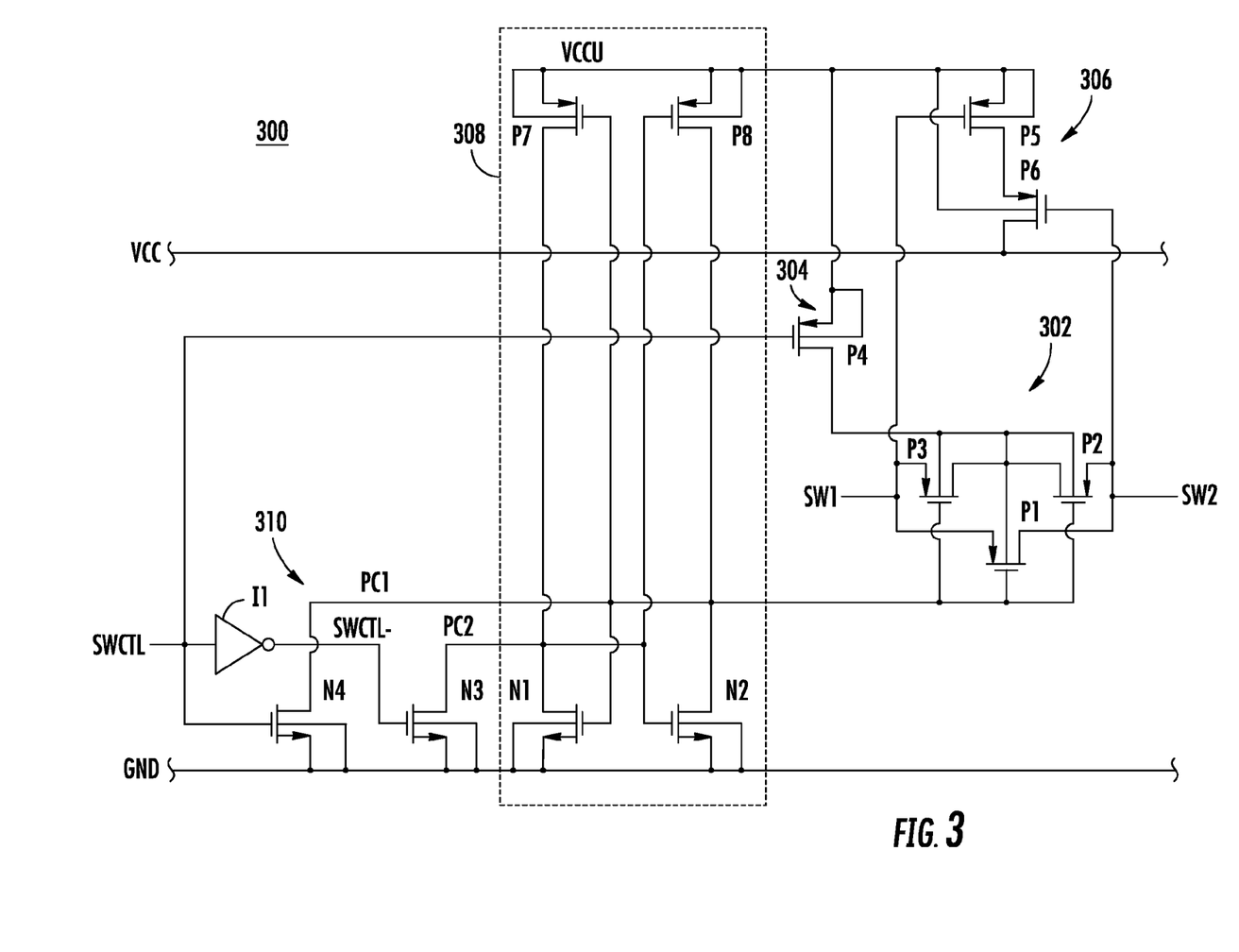
FIG. 3 is a schematic diagram of the P-channel portion of an analog switch according to one embodiment which extends the signal range beyond the regular power supply rails without significant increase in circuit complexity and without a significant increase of DC power supply current.

FIG. 3 is a schematic diagram of the P-channel portion of an analog switch 300 according to one embodiment which extends the signal range beyond the regular power rails without significant increase in circuit complexity and without a significant increase of DC power supply current. Although only the P-channel portion is shown for purposes of simplicity, it is understood by those skilled in the art that an N-channel mirror image and corresponding drive circuitry are employed, as further shown in FIG. 4. The SWCTL signal is provided to the input of the inverter I1 and to the gates of a P-channel device P4 and an N-channel device N4. The inverter I1 is powered between GND and VCC as previously described. The output of inverter I1 provides the SWCTL— signal which is provided to the gate of another N-channel device N3. The drain of N3 is coupled to a second control node PC2, is coupled to the drain of an N-channel device N1 and to the gate of another N-channel device N2. The bodies and the sources of the N-channels devices N1-N4 are all coupled together and coupled to GND, which is the first primary rail voltage. The gates of P-channel devices P1-P3 are coupled together and to the drain of N4. The drain of N4 is coupled to a first control node PC1, and is further coupled to the gate of N1 and to the drain of N2. The P-channel devices P1-P3 are coupled in similar manner as described for the analog switch 200. In particular, the sources of P1 and P3 are coupled together at the switch node SW1. The bodies of P1-P3 are coupled together and to the drains of P2, P3 and P4. The drain of P1 is coupled to the source of P2 at the second switch node SW2.

The analog switch 300 includes the primary upper voltage rail VCC (second primary rail voltage) and further includes a secondary or extended upper voltage rail referred to as VCCU. The body and source of P4 are coupled together and to VCCU. The analog switch 300 includes P-channel devices P5, P6, P7 and P8. The bodies and sources of P5, P7 and P8 are coupled to VCCU. The drain of P5 is coupled to the source of P6, which has its body coupled to VCCU and its drain coupled to VCC. The drains of N1 and N3 are coupled to the gate of N2, which are further coupled to the drain of P7 and to the gate of P8. The drains of N4 and N2 are coupled to the gate of N1, which are further coupled to the gate of P7 and the drain of P8. SW1 is coupled to the gate of P5 and SW2 is coupled to the gate of P6. The devices P1-P3 form a P-type main switch 302 which operates in substantially the same manner as in the analog switch 200 and provide a relatively low ON resistance between the input and output nodes when turned on. P4 is a P-type body driver 304 for driving the bodies of the devices P1-P3 of the main switch 302. The devices P5 and P6 collectively form a P-type rail control switch 306 coupled between the rails VCC and VCCU. The devices P7, P8, N1 and N2 form a gate control latch 308 for the P-type main switch 302 and the devices N3 and N4 form a switch control device 310 for the P-type main switch 302.

In operation, as long as the voltages on the switch nodes SW1 and SW2 are both below VCC by at least the P-channel device threshold voltage, P5 and P6 are both on so that VCCU is effectively clamped to VCC and the analog switch 300 operates in a similar manner as the analog switch 200. In this case, if the SWCTL signal is pulled high turning the analog switch 300 on, then the devices N2 and N4 are turned on, devices N1 and N3 are turned off, body driver P4 is off, the main switch 302 (devices P1-P3) is turned on and the bodies of P1-P3 are effectively coupled between SW1 and SW2. Also, if the SWCTL signal is pulled low turning the analog switch 300 off, N3 is turned on which turns on P8. P8, when turned on, pulls the gates of P1-P3 high turning them off to turn off the main switch 302. The body driver 304 (P4) is turned on so that the bodies of the devices P1-P3 of the main switch 302 are pulled high to VCCU.

If the voltage of either SW1 or SW2 rises above VCC less than the P-channel threshold, P5 and/or P6 turns off releasing VCCU from VCC and allowing VCCU to float. If SWCTL is high to turn on the analog switch 300 in this condition, then the gate of P4 is at the primary upper rail potential (e.g., VCC), and if the voltage on one or both of SW1 and SW2 continues upward into an extended upper voltage range above VCC, the source/bodies of the devices P1-P3 of the main switch 302 and the drain/body of P4 all forward bias, and VCCU is carried up with the signal into the extended upper voltage range. The sources of P7 and P8 in the gate control latch are also carried up with the signal, and the gates of the devices P1-P3 are maintained at GND. In this case the signal between SW1 and SW2 may rise to any level up to the device breakdown voltage level. If instead SWCTL is low to turn off the analog switch 300 while the voltage of either SW1 or SW2 rises above VCC into the extended upper voltage range by less than the P-channel threshold, the gate of P4 is at GND, and, as before, the source/bodies of the devices P1-P3 of the main switch 302 begin to forward bias. As the voltage on the drain of P4 increases, VCCU follows along with the drain of P8, which ensures that the devices P1-P3 remain off.

Figure 4:
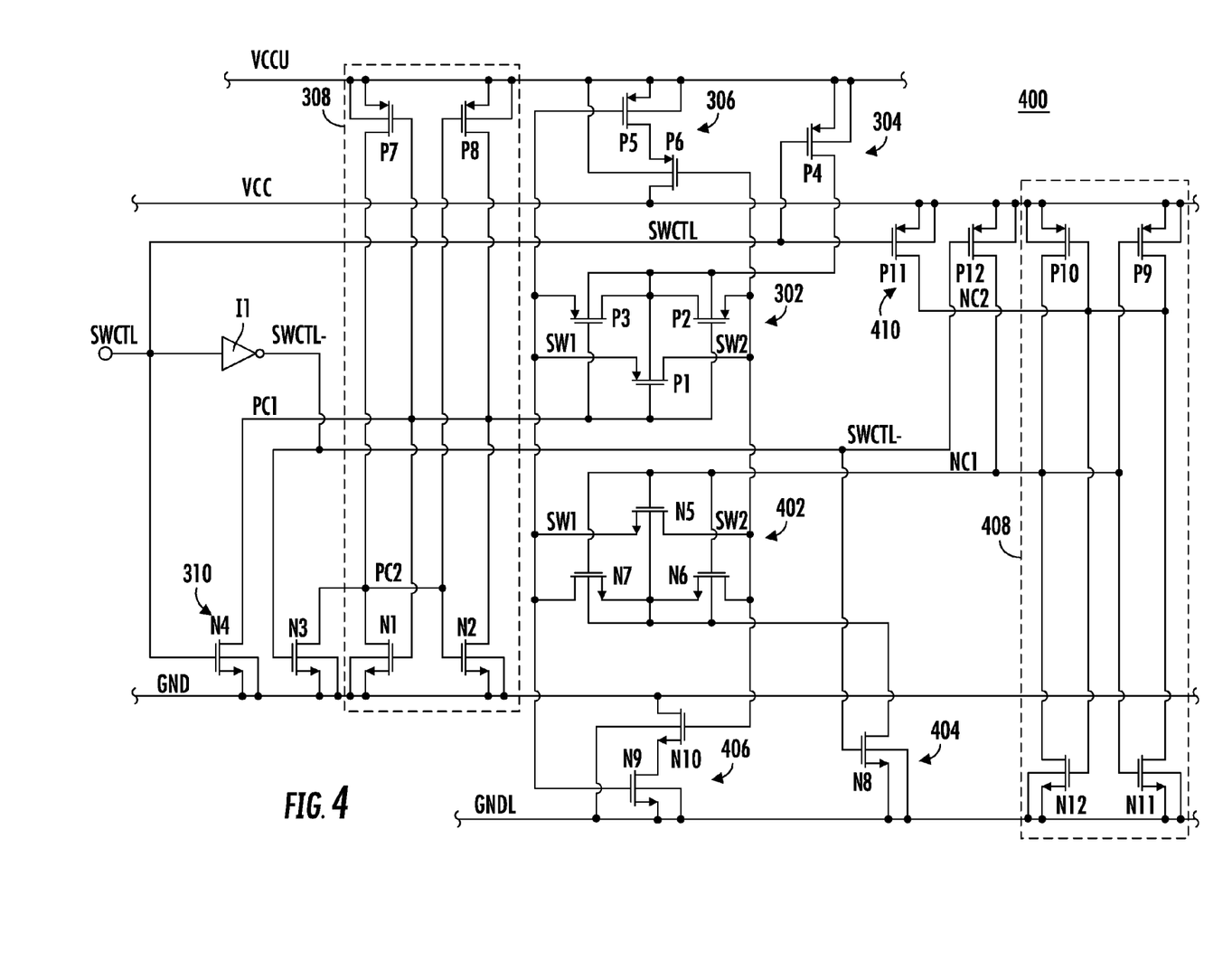
FIG. 4 is a schematic diagram of an analog switch including both the P-channel and N-channel portions which extends the signal range beyond the regular power rails without significant increase in circuit complexity and without a significant increase of DC power supply current.

FIG. 4 is a schematic diagram of an analog switch 400 including both the P-channel and N-channel portions which extends the signal range beyond the regular power rails without significant increase in circuit complexity and without a significant increase of DC power supply current. The SWCTL is provided to the input of the inverter I1 having its output providing the SWCTL—signal in the same manner for controlling the on and off state of the analog switch 400. The inverter I1 is powered between GND and VCC as previously described. The devices P1-P8 and N1-N4 are provided and coupled in substantially identical manner to the GND, VCC and VCCU rails to form the P-type devices including the main switch 302 (P1-P3), the body driver 304, the rail control switch 306, the gate control latch 308, and the switch control device 310. The analog switch 400 further includes the N-channel portion which includes N-channel devices N5-N7 forming an N-type main switch 402, an N-channel device N8 forming an N-type body driver 404, N-channel devices N9 and N10 forming an N-type rail control switch 406, P-channel devices P9 and P10 and N-channel devices N11 and N12 forming an N-type gate control latch 408, and P-channel devices P11 and P12 forming another switch control device 410 for the N-type main switch 402.

The gates of N5-N7 are coupled together at a first control node NC1, which is further coupled to the drains of P10, P12 and N12 and to the gates of P9 and N11. The drain and source of N5 are coupled between the SW1 and SW2 switch nodes. The drain of N7 is coupled to SW1, the drain of N6 is coupled to SW2, and the sources of N6 and N7 are coupled together and to the bodies of N5-N7 and to the drain of N8. SWCTL— is provided to the gate of N8, which has its source and body coupled to a secondary or extended GND rail referred to as GNDL. The drains and sources of N9 and N10 are coupled in series between GND and GNDL. The gate of N9 is coupled to SW1, the gate of N10 is coupled to SW2, and the bodies of N9 and N10 are coupled to GNDL. The sources and bodies of N11 and N12 are coupled to GNDL. The gates of N12 and P10 are coupled together at a second control node NC2, which is further coupled to the drains of P9, P11 and N11. The sources and bodies of P9-P12 are all coupled to VCC. SWCTL is provided to the gate of P11 and SWCTL—is provided to the gate of P12.

In operation, as long as the voltages on the switch nodes SW1 and SW2 are both above GND by at least the N-channel device threshold voltage, N9 and N10 are both on so that GNDL is effectively clamped to GND. In this case, if the SWCTL signal is pulled high turning the analog switch 400 on, then the devices P10 and P12 are turned on, devices P9 and P11 are turned off, body driver N8 is off, the main switch 402 (devices N5-N7) is turned on and the bodies of N5-N7 are effectively coupled between SW1 and SW2. Also, if the SWCTL signal is pulled low turning the analog switch 400 off, P11 is turned on which turns on N12. N12, when turned on, pulls the gates of N5-N7 low turning them off to turn off the main switch 402. The body driver 404 (N8) is turned on so that the bodies of the devices N5-N7 of the main switch 402 are pulled low to GNDL.

If the voltage of either SW1 or SW2 falls below GNDL by less than the N-channel threshold, N9 and/or N10 turns off releasing GNDL from GND and allowing GNDL to float. If SWCTL is high to turn on the analog switch 400 in this condition, then the gate of N8 is at the primary GND rail potential, and if the voltage on one or both of SW1 and SW2 continues downward into an extended lower voltage range below GND, the source/bodies of the devices N5-N7 of the main switch 402 and the drain/body of N8 all forward bias, and GNDL is carried down with the signal into the extended lower voltage range. The sources of N11 and N12 in the gate control latch 408 are also carried down with the signal, and the gates of the devices N5-N7 are maintained at VCC. In this case the signal between SW1 and SW2 may fall to any level down to the device breakdown voltage level. If instead SWCTL is low to turn off the analog switch 400 while either SW1 or SW2 falls below GND into the extended lower voltage range by less than the N-channel threshold, the gate of N8 is at VCC, and, as before, the source/bodies of the devices N5-N7 of the main switch 402 begin to forward bias. As the voltage on the drain of N8 decreases, GNDL follows along with the drain of N12, which ensures that the devices N5-N7 remain turned off.

The switch control signal SWCTL is asserted to a first state (e.g., high or logic one) to turn on the analog switch and is asserted to a second state (e.g., low or logic zero) to turn off the analog switch. The inverter I1 receives the SWCTL signal and provides the inverted SWCTL—signal. The switch control circuit 310 selectively pulls one of the control nodes PC1 or PC2 to GND and the switch control circuit 410 selectively pulls one of the control nodes NC1 or NC2 to VCC based on the state of SWCTL. When SWCTL is high and SWCTL—is low, N4 turns on pulling PC1 to GND to turn on the P-type main switch 302, and P12 turns on pulling NC1 to VCC to turn on the N-type main switch 402. The gate control latch 308 latches PC1 low and PC2 high, and the gate control latch 408 latches NC1 high and NC2 low. The body drivers 304 and 404 are both turned off when the main switches 302 and 402 are turned on. When SWCTL is low and SWCTL—is high, N3 turns on pulling PC2 to GND and P11 turns on pulling NC2 to VCC. The gate control latch 308 responds by pulling PC1 high to the voltage of VCCU to turn off the main switch 302, and the gate control latch 408 responds by pulling NC1 low to the voltage of GNDL to turn off the main switch 402. The body driver 304 is turned on when the main switch 302 is turned off to clamp the body voltage of the main switch 302 to the voltage of the extended voltage rail VCCU. Similarly, the body driver 404 is turned on when the main switch 402 is turned off to clamp the body voltage of the main switch 402 to the voltage of the extended voltage rail GNDL.

While the voltages of the switch nodes SW1 and SW2 remain within the normal voltage range between GND and VCC, the rail control switches 306 and 406 clamp the secondary voltage rails VCCU and GNDL to the primary voltage rails VCC and GND, respectively. If the voltage of either switch node SW1 or SW2 approaches, reaches or otherwise exceeds the VCC voltage into an upper extended voltage range, the rail control switch 306 turns off and releases VCCU from VCC to allow it to float higher with the signal. If the voltage of either switch node SW1 or SW2 approaches, reaches or otherwise drops below the GND voltage into a lower extended voltage range, the rail control switch 406 turns off and releases GNDL from GND to allow it to float lower with the signal.

If the main switches 302 and 402 are turned on, then the gate of P4 is at the primary upper rail potential (e.g., VCC), and as the voltage on one or both of SW1 and SW2 continues upward into an extended upper voltage range above VCC, the source/bodies of the devices P1-P3 of the main switch 302 and the drain/body of P4 all forward bias, and VCCU is carried up with the signal into the extended upper voltage range. The gates of the devices of the main switch 302 are maintained at GND so that it remains turned on. In this case the signal between SW1 and SW2 may rise to any level up to the device breakdown voltage level. Also, when the main switches 302 and 402 are on, then the gate of N8 is at the primary GND rail potential, and if the voltage on one or both of SW1 and SW2 drops and continues downward into the extended lower voltage range below GND, the source/bodies of the devices N5-N7 of the main switch 402 and the drain/body of N8 all forward bias, and GNDL is carried down with the signal into the extended lower voltage range. The gates of the devices N5-N7 of the main switch 402 are maintained at VCC so that it remains turned on. In this case the signal between SW1 and SW2 may fall to any level down to the device breakdown voltage level.

If instead the main switches 302 and 402 are turned off while the voltage of either SW1 or SW2 rises above VCC into the extended upper voltage range by less than the P-channel threshold, the devices P1-P3 of the main switch 302 begin to forward bias. Since the body driver 304 (P4) is turned on, VCCU follows along with the signal in the extended upper voltage range. The gate control latch 308 clamps the gates of the devices P1-P3 to the voltage of VCCU so that the main switch 302 remains off. If the voltage of either SW1 or SW2 falls below GND into the extended lower voltage range by less than the N-channel threshold while the main switches 302 and 402 are turned off, the devices N5-N7 of the main switch 402 begin to forward bias. Since the body driver 404 (N8) is turned on, GNDL follows along with the signal in the extended lower voltage range. The gate control latch 408 clamps the gates of the devices N5-N7 to the voltage of GNDL so that the main switch 403 remains turned off.

Although the present invention has been described in considerable detail with reference to certain preferred versions thereof, other versions and variations are possible and contemplated. For example, circuits or logic blocks described herein may be implemented as discrete circuitry or integrated circuitry or software or any alternative configurations. Also, the circuitry is shown operating with an upper voltage rail VCC and a lower voltage rail GND, where it is understood that the circuitry may operate between upper and lower rails of any upper and lower voltage levels. Finally, those skilled in the art should appreciate that they can readily use the disclosed conception and specific embodiments as a basis for designing or modifying other structures for carrying out the same purposes of the present invention without departing from the spirit and scope of the invention as defined by the appended claims.

The invention claimed is:

1. A switch circuit which selectively couples first and second switch nodes together and which enables the first and second switch nodes to operate in an extended voltage range outside a normal voltage range which is between first and second supply voltage rails, comprising:
    a secondary voltage rail;
    a switch device having a current path coupled between the first and second switch nodes, a control terminal, and a body, wherein said switch device couples the first and second switch nodes together when turned on;
    a body driver coupled between said body of said switch device and said secondary voltage rail, wherein said body driver device clamps said body of said switch device to said secondary voltage rail when turned on, and forward biases to allow voltage of said secondary voltage rail to follow voltage of said body of said switch device if voltage of said body of said switch device extends outside voltage of the second supply rail into the extended voltage range when turned off;
    a rail control switch having a current path coupled between the second supply voltage rail and said secondary voltage rail, having a first control terminal coupled to the first switch node and a second control terminal coupled to the second switch node, wherein said rail control switch clamps said secondary voltage rail to said second supply voltage rail when the first and second switch nodes are both within the normal voltage range, and wherein said rail control switch releases said secondary voltage rail if voltage of either one of the first and second switch nodes extends into said first extended voltage range; and
    a switch control circuit which switches between an on state and an off state, wherein in said on state, said switch control circuit clamps said control terminal of said switch device to the first supply voltage rail and turns off said body driver, and wherein in said off state, said switch control circuit clamps said control terminal of said switch device to said secondary voltage rail and turns on said body driver.

2. The switch circuit of claim 1, wherein said switch control circuit comprises:
    a switch controller which pulls a first control node to the first supply voltage rail in said on state, and which pulls a second control node to the first supply voltage rail in said off state, and which turns on and off said body driver, wherein said first control node is coupled to said control terminal of said switch device; and
    a latch circuit which clamps said first control node to the first supply voltage in said on state, and which clamps said first control node to said secondary voltage rail in said off state.

3. The switch circuit of claim 2, wherein:
    said switch controller comprises:
        a first semiconductor device having current terminals coupled between the first supply voltage rail and said first control node, a body coupled to the first supply voltage rail, and a control terminal receiving a first switch control signal; and
        a second semiconductor device having current terminals coupled between the first supply voltage rail and said second control node, a body coupled to the first supply voltage rail, and a control terminal receiving a second switch control signal which is inverted relative to said first switch control signal; and
    wherein said latch circuit comprises:
        a third semiconductor device having current terminals coupled between the first supply voltage rail and said second control node, a body coupled to the first supply voltage rail, and a control terminal coupled to said first control node;
        a fourth semiconductor device having current terminals coupled between the first supply voltage rail and said first control node, a body coupled to the first supply voltage rail, and a control terminal coupled to said second control node;
        a fifth semiconductor device having current terminals coupled between said secondary voltage rail and said second control node, a body coupled to said secondary voltage rail, and a control terminal coupled to said first control node; and
        a sixth semiconductor device having current terminals coupled between said secondary voltage rail and said first control node, a body coupled to said secondary voltage rail, and a control terminal coupled to said second control node.

4. The switch circuit of claim 3, wherein the first supply voltage rail is a lower supply voltage rail and the second supply voltage rail is an upper supply voltage rail, wherein the extended voltage range is above the upper supply voltage rail, wherein said first, second, third and fourth semiconductor devices comprise N-channel devices, and wherein said fifth and sixth semiconductor devices comprise P-channel devices.

5. The analog switch of claim 3, wherein the first supply voltage rail is an upper supply voltage rail and the second supply voltage rail is a lower supply voltage rail, wherein the extended voltage range is below said lower supply voltage rail, wherein said first, second, third and fourth semiconductor devices comprise P-channel devices, and wherein said fifth and sixth semiconductor devices comprise N-channel devices.

6. The switch circuit of claim 1, wherein the first supply voltage rail is a lower supply voltage rail and the second supply voltage rail is an upper supply voltage rail, wherein the extended voltage range is above the upper supply voltage rail, and wherein said switch device, said body driver and said rail control switch are P-channel devices.

7. The switch circuit of claim 6, wherein:
said switch device comprises:
   a first PMOS device having current terminals coupled between the first and second switch nodes, a gate coupled to said switch control circuit, and a body;
   a second PMOS device having current terminals coupled between the first switch node and said body of said first PMOS device, a gate coupled to said gate of said first PMOS device, and a body coupled to said body of said first PMOS device; and
   a third PMOS device having current terminals coupled between the second switch node and said body of said first PMOS device, a gate coupled to said gate of said first PMOS device, and a body coupled to said body of said first PMOS device;
wherein said body driver comprises a fourth PMOS device having current terminals coupled between said body driver of said first PMOS device and said secondary voltage rail, a gate coupled to said switch control circuit, and a body coupled to said secondary voltage rail; and
wherein said rail control switch comprises:
   a fifth PMOS device having a first current terminal and a body coupled to said secondary voltage rail, a gate coupled to the first switch node, and a second current terminal; and
   a sixth PMOS device having a first current terminal coupled to said second current terminal of said fifth PMOS device, a second current terminal coupled to the second supply voltage rail, a body coupled to said secondary voltage rail, and a gate coupled to the second switch node.

8. The switch circuit of claim 1, wherein the first supply voltage rail is an upper supply voltage rail and the second supply voltage rail is a lower supply voltage rail, wherein the extended voltage range is below said lower supply voltage rail, and wherein said switch device, said body driver and said rail control switch are N-channel devices.

9. The switch circuit of claim 8, wherein:
said switch device comprises:
   a first NMOS device having current terminals coupled between the first and second switch nodes, a gate coupled to said switch control circuit, and a body;
   a second NMOS device having current terminals coupled between the first switch node and said body of said first NMOS device, a gate coupled to said gate of said first NMOS device, and a body coupled to said body of said first NMOS device; and
   a third NMOS device having current terminals coupled between the second switch node and said body of said first NMOS device, a gate coupled to said gate of said first NMOS device, and a body coupled to said body of said first NMOS device;
wherein said body driver comprises a fourth NMOS device having current terminals coupled between said body driver of said first NMOS device and said secondary voltage rail, a gate coupled to said switch control circuit, and a body coupled to said secondary voltage rail; and
wherein said rail control switch comprises:
   a fifth NMOS device having a first current terminal and a body coupled to said secondary voltage rail, a gate coupled to the first switch node, and a second current terminal; and
   a sixth NMOS device having a first current terminal coupled to said second current terminal of said fifth NMOS device, a second current terminal coupled to the second supply voltage rail, a body coupled to said secondary voltage rail, and a gate coupled to the second switch node.

10. An analog switch, comprising:
a first main switch having a control terminal, having first and second current terminals coupled between first and second switch nodes, respectively, and having a body, wherein said first main switch couples first and second switch nodes together when turned on;
first and second supply voltage rails collectively determining a normal voltage range and determining a first extended voltage range outside said second supply voltage rail away from said first supply voltage rail and a second extended voltage range outside said first supply voltage rail away from said second supply voltage rail;
a first extended voltage rail;
a first rail control switch which pulls said first extended voltage rail to said second supply voltage rail when both of said first and second switch nodes have a voltage within said normal voltage range, and which releases said first extended voltage rail from said second supply voltage rail when voltage of either of said first and second switch nodes is in said first extended voltage range;
a first body driver which, when turned on, pulls said body of said first main switch to said first extended voltage rail, and which, when turned off, enables said first extended voltage rail to follow voltage of either one of said first and second switch nodes into said first extended voltage range; and
a switch control circuit which, in a first state, turns on said first main switch and turns off said first body driver, and, in a second state, which turns off said first main switch, turns on said first body driver, and pulls said control terminal of said first main switch to said first extended voltage rail.

11. The analog switch of claim 10, wherein said first rail control switch comprises first and second semiconductor devices each having a current path and a control terminal, wherein said current path of said first semiconductor device is coupled in series with said current path of said second semiconductor device between said second supply voltage rail and said first extended voltage rail, wherein said control terminal of said first semiconductor device is coupled to said first switch node, and wherein said control terminal of said second semiconductor device is coupled to said second switch node.

12. The analog switch of claim 10, wherein said first body driver comprises a semiconductor device having a current path coupled between said body of said first main switch and said first extended voltage rail, having a control terminal coupled to said switch control circuit, and having a body coupled to said first extended voltage rail.

13. The analog switch of claim 10, wherein said first main switch comprises:
  first, second and third semiconductor devices each having a current path, a body, and a control terminal;
  wherein said control terminal of each of said first, second and third semiconductor devices is coupled to said switch control circuit;
  wherein said bodies of said first, second and third semiconductor devices are coupled together and to said first body driver; and
  wherein said current path of said first semiconductor device is coupled between said first and second switch nodes, wherein said current path of said second semiconductor device is coupled between said first switch node and said body of said first semiconductor device, and wherein said current path of said third semiconductor device is coupled between said second switch node and said body of said first semiconductor device.

14. The analog switch of claim 10, wherein said switch control circuit comprises a control latch which pulls said control terminal of said first main switch to said first supply voltage rail in said first state, and which pulls said control terminal of said first main switch to said first extended voltage rail in said second state.

15. The analog switch of claim 14, wherein said control latch comprises:
  a first semiconductor device having a current path coupled between said first extended voltage rail and a latch control node, a control terminal coupled to said control terminal of said first main switch, and a body coupled to said first extended voltage rail;
  a second semiconductor device having a current path coupled between said extended voltage rail and said control terminal of said first main switch, a control terminal coupled to said latch control node, and a body coupled to said first extended voltage rail;
  a third semiconductor device having a current path coupled between said first supply voltage rail and said latch control node, a control terminal coupled to said control terminal of said first main switch, and a body coupled to said first supply voltage rail; and
  a fourth semiconductor device having a current path coupled between said first supply voltage rail and said control terminal of said first main switch, a control terminal coupled to said latch control node, and a body coupled to said first supply voltage rail.

16. The analog switch of claim 15, wherein said switch control circuit further comprises a switch controller which pulls said control terminal of said first main switch to said first supply voltage node and which turns off said first body driver in said first state, and which pulls said latch control node to said first supply voltage node and which turns on said first body driver in said second state.

17. The analog switch of claim 16, wherein said switch controller comprises:
  first and second switch control nodes asserted to opposite states relative to each other to determine said first and second states of said switch control circuit;
  a fifth semiconductor device having a current path coupled between said control terminal of said first main switch and said first supply voltage rail, having a body coupled to said first supply voltage rail, and a control terminal coupled to said first switch control node; and
  a sixth semiconductor device having a current path coupled between said latch control node and said first supply voltage rail, having a body coupled to said first supply voltage rail, and a control terminal coupled to said second switch control node.

18. The analog switch of claim 10, further comprising:
  a second main switch having a control terminal, having first and second current terminals coupled between said first and second switch nodes, respectively, and having a body, wherein said second main switch couples first and second switch nodes together when turned on;
  a second extended voltage rail;
  a second rail control switch which pulls said second extended voltage rail to said first supply voltage rail when both of said first and second switch nodes have a voltage within said normal voltage range, and which releases said second extended voltage rail from said first supply voltage rail when voltage of either of said first and second switch nodes is in said second extended voltage range;
  a second body driver which, when turned on, pulls said body of said second main switch to said second extended voltage rail, and which, when turned off, enables said second extended voltage rail to follow voltage of either one of said first and second switch nodes into said second extended voltage range; and
  wherein said switch control circuit which, in said first state, turns on said second main switch and turns off said second body driver, and, in said second state, which turns off said second main switch, turns on said second body driver, and pulls said control terminal of said second main switch to said second extended voltage rail.

19. A method of enabling first and second switch nodes of an analog switch to operate in an extended voltage range outside a normal voltage range between first and second supply voltage rails, the analog switch having a control terminal, a body, and current terminals which are coupled between first and second switch nodes, said method comprising:
  providing a secondary voltage rail;
  clamping the secondary voltage rail to the second supply voltage rail when the voltages of both of the first and second switch nodes are within the normal voltage range, and releasing the secondary voltage rail from the second supply voltage rail when the voltage either one of the first and second switch nodes extends outside the second supply voltage rail;
  clamping the control terminal of the analog switch to the first supply voltage rail to turn it on, and clamping the control terminal of the analog switch to the secondary voltage rail to turn it off;
  clamping the body of the analog switch to the secondary voltage rail when the analog switch is turned off; and
  allowing voltage of the secondary voltage rail to follow voltage of the body of the analog switch into the extended voltage range when the analog switch is turned on.

20. The method of claim 19, wherein said clamping the body of the analog switch to the secondary voltage rail when the analog switch is turned off and said allowing voltage of the secondary voltage rail to follow voltage of the body of the analog switch into the extended voltage range when the analog switch is turned on comprises:
  providing a body driver having a current path and body diode coupled between the body of the analog switch and the secondary voltage rail which forward biases when turned off and when the voltage of the body exceeds voltage of the secondary voltage rail; and
  turning the body driver on to clamp the body of the analog switch to the secondary voltage rail when the analog switch is turned off.

* * * * *